(12) United States Patent
Pentlehner et al.

(10) Patent No.: US 12,495,669 B2
(45) Date of Patent: *Dec. 9, 2025

(54) ORGANIC ELECTRONIC COMPONENT WITH ELECTRON INJECTION LAYER

(71) Applicant: Pictiva Displays International Limited, Dublin (IE)

(72) Inventors: Dominik Pentlehner, Burghausen (DE); Andreas Rausch, Regensburg (DE); Ulrich Niedermeier, Leiblfing (DE); Julia Desjardins, Regensburg (DE)

(73) Assignee: Pictiva Displays International Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 18/140,758

(22) Filed: Apr. 28, 2023

(65) Prior Publication Data

US 2023/0337463 A1    Oct. 19, 2023

Related U.S. Application Data

(63) Continuation of application No. 17/677,223, filed on Feb. 22, 2022, now Pat. No. 11,672,145, which is a
(Continued)

(30) Foreign Application Priority Data

Jan. 20, 2017    (DE) .......................... 102017101077.7

(51) Int. Cl.
*H10K 59/12*    (2023.01)
*H10K 50/17*    (2023.01)
(Continued)

(52) U.S. Cl.
CPC ........... *H10K 59/12* (2023.02); *H10K 50/171* (2023.02); *H10K 50/81* (2023.02); *H10K 50/82* (2023.02); *H10K 50/18* (2023.02)

(58) Field of Classification Search
CPC ............. H01L 51/5092; H01L 51/5221; H01L 51/5206; H01L 51/5096; H01L 27/3244;
(Continued)

(56) References Cited

U.S. PATENT DOCUMENTS 6,509,109 B1 *   1/2003   Nakamura ............. H10K 50/11
                                                        428/917
8,319,420 B2    11/2012   Park et al.
(Continued)

FOREIGN PATENT DOCUMENTS

CN          104638162 A      5/2015
JP          2016058497 A     4/2016
(Continued)

OTHER PUBLICATIONS

Lüssem, B., et al., "Doping of Organic Semiconductors," Physica Status Solidi, vol. 210, Issue 1, Dec. 20, 2012, pp. 9-43.
(Continued)

*Primary Examiner* — Eric W Jones
(74) *Attorney, Agent, or Firm* — Botos Churchill IP Law LLP

(57) ABSTRACT

A device is disclosed. In an embodiment the device includes an anode, an organic active layer above the anode, an organic layer sequence above the organic active layer, a metallic layer above the organic layer sequence and a cathode above the metallic layer, wherein the metallic layer includes Yb.

18 Claims, 2 Drawing Sheets

Related U.S. Application Data continuation of application No. 16/811,400, filed on Mar. 6, 2020, now Pat. No. 11,289,551, which is a continuation of application No. 15/874,775, filed on Jan. 18, 2018, now Pat. No. 10,629,660.

(51) Int. Cl.
*H10K 50/18* (2023.01)
*H10K 50/81* (2023.01)
*H10K 50/82* (2023.01)

(58) Field of Classification Search
CPC ...... H10K 59/12; H10K 50/81; H10K 50/171; H10K 50/82; H10K 50/18
USPC ...................................................... 257/40, 59
See application file for complete search history.

(56) References Cited

U.S. PATENT DOCUMENTS

| | | |
|---|---|---|
| 9,450,198 B2 | 9/2016 | Yamamoto et al. |
| 9,797,567 B2 | 10/2017 | Kastner-Jung et al. |
| 10,333,089 B2 | 6/2019 | Rausch et al. |
| 10,629,660 B2 * | 4/2020 | Pentlehner ............. H10K 50/81 |
| 11,672,145 B2 * | 6/2023 | Pentlehner ............. H10K 50/82 257/40 |
| 2003/0068528 A1 | 4/2003 | Thompson et al. |
| 2003/0080324 A1 | 5/2003 | Marks et al. |
| 2005/0030267 A1 * | 2/2005 | Tanghe ................ G09G 3/3216 345/82 |
| 2006/0251922 A1 | 11/2006 | Liao et al. |
| 2007/0085474 A1 * | 4/2007 | Spindler .............. H10K 50/125 428/917 |
| 2007/0170421 A1 | 7/2007 | Liao et al. |
| 2007/0222367 A1 * | 9/2007 | Hosoda ................ H10K 59/351 313/503 |
| 2008/0231178 A1 | 9/2008 | Park et al. |
| 2009/0091918 A1 | 4/2009 | Koyama |
| 2011/0240971 A1 | 10/2011 | Nowatari et al. |
| 2012/0126219 A1 | 5/2012 | Sato et al. |
| 2012/0298967 A1 | 11/2012 | Cho et al. |
| 2013/0228753 A1 | 9/2013 | Moon et al. |
| 2014/0339524 A1 | 11/2014 | Shitagaki et al. |
| 2014/0361286 A1 | 12/2014 | Jaeger et al. |
| 2015/0188074 A1 | 7/2015 | Heo et al. |
| 2016/0155991 A1 | 6/2016 | Jaeger et al. |
| 2016/0204360 A1 | 7/2016 | You et al. |
| 2016/0211467 A1 | 7/2016 | Yamada et al. |
| 2016/0260920 A1 | 9/2016 | Rausch et al. |
| 2018/0190908 A1 | 7/2018 | Ke et al. |
| 2019/0006589 A1 | 1/2019 | Senkovskyy et al. |

FOREIGN PATENT DOCUMENTS

| | | |
|---|---|---|
| WO | 2010066245 A1 | 6/2010 |
| WO | 2017001353 A1 | 1/2017 |

OTHER PUBLICATIONS

Office Action from corresponding German Patent Applcation No. 10 2017 101 077.7 dated Feb. 11, 2025 (16 pp.).

* cited by examiner

ORGANIC ELECTRONIC COMPONENT WITH ELECTRON INJECTION LAYER

CROSS-REFERENCE TO RELATED APPLICATIONS

This application is a continuation of U.S. application Ser. No. 17/677,223, filed Feb. 22, 2022, now allowed, which is a continuation of U.S. application Ser. No. 16/811,400, filed Mar. 6, 2020, now U.S. Pat. No. 11,289,551, issued on Mar. 29, 2022, which is a continuation of U.S. application Ser. No. 15/874,775, filed Jan. 18, 2018, issued as U.S. Pat. No. 10,629,660 on Apr. 21, 2020, which claims priority to German Application No. 102017101077.7, filed Jan. 20, 2017, all of which are incorporated herein by reference.

BACKGROUND OF THE INVENTION

The invention relates to an organic electronic component and to a method for producing an organic electronic component.

BRIEF SUMMARY OF THE INVENTION

Embodiments provide an organic electronic component, which has increased stress stability during operation and/or storage, in particular, at high temperatures. Further embodiments provide a cost-effective and simple method for producing an organic electronic component.

Embodiments provide an organic electronic component. The organic electronic component may comprise an anode, an active layer arranged above the anode, an electron injection layer arranged above the active layer, and a cathode arranged above the electron injection layer.

Here and in the following, the term "on" or "above" regarding the arrangement of the layers means a fundamental sequence and is to be understood in that way, that a first layer is arranged either on a second layer in a way, that the layers have a common interface, that is to say are in direct mechanical and/or electrical contact with one another, or that further layers are arranged between the first layer and the second layer.

According to at least one embodiment, the electron injection layer comprises a first organic layer comprising a first organic matrix material, a second organic layer comprising a second organic matrix material, and a metallic layer. Surprisingly, it has been found that organic electronic components with such an electron injection layer have a high voltage stability during the operation of the component and/or during its storage, in particular even at temperatures above room temperature, for example, above 100° C. By means of the inventive electron injection layer, an efficient electron injection is thus surprisingly possible even in operation of the component at high temperatures and after storage of the component at high temperatures. If the organic electronic component is an organic light-emitting diode, an additional high light yield and a good luminance stability, which can likewise be attributed to the inventive effective electron injection into the active layer, which is in particular even very effective if the light-emitting diode is exposed to high temperatures over a relatively long period of time. In particular, organic light-emitting diodes are particularly suitable for use in the automobile sector, in which the organic light-emitting diodes can be exposed to higher temperatures.

According to at least one embodiment, the first organic matrix material has a higher electron conductivity than the second organic matrix material. The first organic matrix material and the second organic matrix material are thus in particular different organic matrix materials. The second organic layer of the electron injection layer is arranged between the metallic layer and the first organic layer, the electron injection is particularly effective and constant or almost constant over a long period of time, in particular even at temperatures which are higher than room temperature, for example, up to 150° C. If the first organic layer would directly adjoin the metallic layer, no more or almost no electron injection takes place, and the voltage of the component in the operation thereof would increase considerably at the same current.

Here and in the following, a layer is arranged "between" two other layers, such that the one layer is arranged immediately in direct mechanical and/or electrical contact or in indirect contact to one of the two other layers and in direct mechanical and/or electrical contact or in indirect contact to the other one of the two other layers. In the case of indirect contact, further layers may then be arranged between the one and the at least one of the two other layers.

According to at least one embodiment, the second organic layer is arranged over the entire surface over the first organic layer and the metallic layer is arranged over the entire surface over the second organic layer. In particular, there is no mechanical contact between the first organic layer and the metallic layer, since this can lead to a drastic reduction in the electron injection. In other words, the first organic layer and the metallic layer preferably have no common interface.

The organic electronic component may be, for example, an organic light-emitting diode (OLED), an organic field-effect transistor or bipolar transistor, an organic photodetector or an organic solar cell.

According to at least one embodiment, the active layer is a light-emitting layer, which is configured to emit radiation during operation of the component. According to this embodiment, the organic electronic component is in particular an organic light-emitting diode.

According to at least one embodiment, the first organic matrix material is a material, which cannot be conductivity-doped by a metal. This can be seen, for example, that the operating voltage of the component has a constantly low value without metal doping of the first organic layer, and in the case of doping with a metal, no significant reduction of the operating voltage is achieved. Doping of the first organic matrix material with a metal thus does not lead to improved electron conductivity. For example, EM036 from Merck or NET18 from Novaled may be selected as the first organic matrix material.

According to at least one embodiment, the first organic matrix material cannot be conductivity-doped by a metal. This means that the electron conductivity is not improved by the metal doping.

According to at least one embodiment, the second organic matrix material is a material, which can be conductivity-doped by a metal. This can be seen, for example, that the operating voltage of the component having a metal doping of the second organic layer has a constantly low value, while in comparison thereto, without doping with a metal, the operating voltage of the component is significantly higher and, under some circumstances, significantly increases with time. Doping of the second organic matrix material with a metal thus leads to an improved electron injection. For example, ET093 from Merck or NET218 or NET382 from Novaled may be selected as the second organic matrix material.

According to at least one embodiment, the second organic matrix material can be conductivity-doped by means of a metal. This means that the electron injection is or may be improved by means of a metal doping.

According to at least one embodiment, the first organic matrix material has a high intrinsic electron conductivity. A high intrinsic electron conductivity means in particular that the voltage of the component up to a thickness of, for example, 200 nm of the first organic layer is independent or virtually independent of the thickness of the first organic layer.

According to at least one embodiment, the second organic matrix material has a low intrinsic electron conductivity. A low intrinsic electron conductivity means in particular that the voltage of the component increases significantly during a significant increase in the thickness of the second organic layer, for example, by more than 0.3 V.

According to at least one embodiment, the electron injection layer consists of the first organic layer, the second organic layer and the metallic layer. It is therefore a three-layer electron injection layer.

According to at least one embodiment, the first organic layer is arranged above the active layer, in particular the light-emitting layer, the second organic layer is arranged above the first organic layer and the metallic layer is arranged above the second organic layer.

According to at least one embodiment, the cathode is arranged directly above the metallic layer. According to this embodiment, the cathode is in direct electrical and mechanical contact to the metallic layer.

According to at least one embodiment, the first organic layer is not doped with a metal. It is possible for the first organic layer to consist essentially of the first matrix material. A metal doping of layers in the direct vicinity of a light-emitting layer has proven to be disadvantageous. The metal may migrate into the light-emitting layer and lead to an emission extinction, which has a negative effect on the luminance and should thus be avoided. Preferably, there is a direct mechanical contact between the first organic layer and the light-emitting layer, or a direct mechanical contact between the first organic layer and an additional hole blocking layer arranged above the light-emitting layer. Particularly preferably, the first organic layer is arranged over the entire surface above the light-emitting layer or the hole blocking layer.

According to at least one embodiment, the metallic layer has a layer thickness of between 1 nm inclusive and 10 nm inclusive, preferably between 1 nm and 4 nm. In the case of layer thicknesses of less than one nanometer, the electron injection decreases and thus the voltage of the component increases with the same current.

According to at least one embodiment, the metallic layer comprises a metal selected from a group comprising lithium, sodium, calcium, magnesium, ytterbium, cesium, strontium, rubidium, potassium, and combinations thereof. The metallic layer may also consist essentially of these metals.

According to at least one embodiment, the metallic layer comprises a metal or consists essentially of a metal and the second organic layer is doped with the metal of the metallic layer at least in partial regions. The second organic layer can thus be doped completely or only in partial regions with the metal. For example, the metal may be partially driven into the second organic layer during the application of the metal layer. It is also possible for the metal (atoms or ions of the metal) penetrating into the second organic layer partially during the operation of the component. The doping can thus be carried out automatically without the need for expensive and complex deposition modules for metal doping. Advantageously, the metal of the metal layer cannot expand or penetrate into the first organic layer of the electron injection layer, since the first organic matrix material forms a barrier for the penetration of the metal. As a result, the migration of the metal atoms or ions into the first organic layer and thus also into the active layer is prevented and, in the vicinity, and in the active layer, in particular the light-emitting layer, there are no or substantially less trap states caused by the metal, which may lead to an emission extinction. Overall, the inventive electron injection layer increases the stability of the component, in particular the voltage and luminance stability. In particular, the voltage and luminance stability is maintained even under storage and/or operation of the component at elevated temperatures.

According to at least one embodiment, the second organic layer is completely doped with the metal of the metal layer. In this case, a concentration gradient of the doping may be present, wherein in particular the concentration of metal in the second organic layer increases in the direction from the first organic layer to the metallic layer.

According to at least one embodiment, the second organic layer comprises a first partial layer and a second partial layer or consists essentially of a first and a second partial layer. The first partial layer is preferably arranged above the first organic layer and the second partial layer is arranged between the first partial layer and the metallic layer. The second partial layer comprises the second matrix material and is doped with the metal of the metallic layer. In particular, the second partial layer consists essentially of the second matrix material and the metal of the metallic layer. In this case, a concentration gradient of the doping may be present, wherein in particular the concentration of metal in the second partial layer increases in the direction from the first organic layer to the metallic layer.

The first partial layer comprises the second organic matrix material and is in particular not doped with the metal of the metallic layer. The first partial layer may also consist essentially of the second organic matrix material.

According to at least one embodiment, the second organic layer has a layer thickness between 2 nm inclusive and 20 nm inclusive, preferably between 2 nm inclusive and 10 nm inclusive. If the layer thickness is selected to be greater than 20 nm, the voltage of the component increases with the same current, since the electron injection decreases, with which the electron injection layer would no longer fulfill its function or would only fulfill its function to a minor extent.

According to at least one embodiment, the first organic layer has a layer thickness of between 5 nm inclusive and 200 nm inclusive, preferably between 5 nm inclusive and 60 nm inclusive.

According to at least one embodiment, a hole blocking layer is arranged between the active layer and the electron injection layer.

According to at least one embodiment, the hole blocking layer comprises an organic material, which has a lower-lying HOMO (highest occupied molecular orbital) than the first organic matrix material or the second organic matrix material. The hole blocking layer can thus be distinguished from known electron transport or electron injection layers.

According to at least one embodiment, the hole blocking layer comprises TMM-147, TMM-127, TMM-004, BAlq, BCP, TAZ, PBD, TPBI, Spiro-TAD or consists essentially of one of these materials.

In the organic light-emitting diode, for example, the anode or the cathode may be transparent and the other may be configured to be reflective. The organic light-emitting diode can thus be designed either as a bottom emitter or as a top emitter. Alternatively, the anode and the cathode may also be transparent. If both the anode and the cathode are transparent, the organic light-emitting diode can be referred to as a transparent OLED.

Here and in the following, a layer which is transmissive to visible radiation is referred to as transparent, in particular for radiation, which is generated in the light-emitting layer during operation of the organic light-emitting diode. In this case, a transparent layer can be clearly translucent. Particularly preferably, a layer referred to as transparent has a lowest possible absorption of radiation.

The anode and the cathode can, independently of one another, have a material selected from a group comprising metals, electrically conductive polymers, transition metal oxides and conductive transparent oxides (TCO). The anode and cathode may also be layer stacks of a plurality of layers of the same or different metals or the same or different TCOs.

Suitable metals for the cathode and the anode are, for example, Ag, Pt, Au, Mg, Al, Ba, In, Ca, Sm or Li, and compounds, combinations or alloys thereof.

If the cathode is formed from a metal in the component, this metal is in particular a different metal than the metal of the metallic layer.

Transparent conductive oxides (short "TCO") are transparent, conductive materials, generally metal oxides, such as, for example, zinc oxide, tin oxide, cadmium oxide, titanium oxide, indium oxide or indium tin oxide (ITO). In addition to binary metal-oxygen compounds, such as, for example, ZnO, $SnO_2$ or $In_2O_3$, also ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides include to the group of TCOs. Furthermore, the TCOs do not necessarily correspond to a stoichiometric composition and can also be p-or n-doped.

Materials which have a radiation emission on the basis of fluorescence or phosphorescence are suitable as materials for the light-emitting layer of an organic light-emitting diode. Examples of fluorescent materials are polyfluorene, polythiophene or polyphenylene or derivatives, compounds, mixtures or copolymers thereof. Ir(ppy)3, Ir(MDQ)2(acac), O7960, TER-056, TER-096, RD-004, RD-1932 and further materials with the central ions iridium and platinum can serve as phosphorescent materials.

According to at least one embodiment, the organic electronic component comprises a hole transport layer, a hole injection layer and/or an electron blocking layer. Said layers are arranged in particular between the anode and the active layer. The hole injection layer can be arranged above the anode, the hole transport layer can be arranged above the hole injection layer and the electron-blocking layer can be arranged above the hole transport layer. Materials for said layers are known to the person skilled in the art.

According to at least one embodiment, the organic electronic component has a substrate, on which the cathode and/or the anode, preferably the anode, is applied. The substrate can have, for example, one or more materials in the form of a layer, a plate, a film or a laminate, which are selected, for example, from steel, glass, quartz, plastic, metal.

According to at least one embodiment, the anode and/or the cathode, preferably above the cathode, an encapsulation is arranged, for example, a thin-film encapsulation, which can protect the layers arranged underneath from harmful external influences such as, for example, moisture, oxygen and other substances. Preferably, the encapsulation arrangement is in direct mechanical contact with the cathode.

With regard to the basic structure of an organic electronic component, in particular an organic light-emitting diode, reference is made to the publication WO 2010/066245 A1, which is hereby expressly incorporated by reference with regard to the structure and the layer compositions.

A method for producing an organic electronic component is provided. All features specified under the organic electronic component can also be features of the method for producing the organic electronic component and vice versa.

According to one embodiment, the method for producing an organic electronic component comprises the following method steps, preferably in the specified order: A) providing an anode, B) applying an active layer on the anode, D) applying an electron injection layer on the active layer; and E) applying a cathode on the electron injection layer.

According to at least one embodiment, step D) comprises the following method steps: D1) applying a first organic layer comprising a first organic matrix material on the active layer, D2) applying a second organic layer comprising a second organic matrix material on the first organic layer, D3) applying a metallic layer on the second organic layer.

During or during method step D3), the metal may be driven into the second organic layer. The doping can thus be carried out automatically without the need for conventional, expensive and complex deposition modules for metal doping. As a result, the processability of the component overall is greatly simplified.

According to at least one embodiment, a method step C) takes place between method step B) and D): C) applying a hole blocking layer on the active layer.

BRIEF DESCRIPTION OF THE DRAWINGS

Further advantageous embodiments and developments of the invention result from the exemplary embodiments described in the following in conjunction with the figures.

In the exemplary embodiments and figures, identical or identically acting constituent parts are each provided with the same reference symbols. The elements illustrated and their size relationships among one another are not to be regarded as true to scale, rather, individual elements, in particular layer thicknesses, can be represented with an exaggerated size in order to afford a better understanding.

DETAILED DESCRIPTION

Figure 1A:
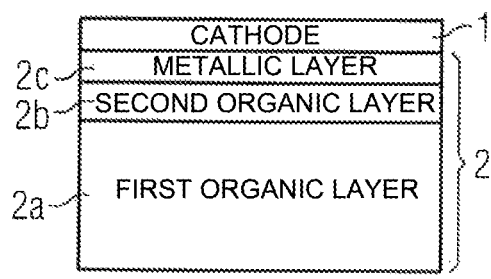
FIGS. 1A, 1B and 1C show schematic side views of a section of an organic electronic component.

FIG. 1A shows a schematic side view of a section of an organic electronic component, in particular an organic light-emitting diode. The section shows an electron injection layer 2 consisting of a first organic layer 2*a*, a second organic layer 2*b* and a metallic layer 2*c*. The first organic layer 2*a* comprises a first organic matrix material, for example, NET18 or ETM036, or consists essentially of the first organic matrix material. The second organic layer 2*b* is arranged over the entire surface of the first organic layer 2*a*. The second organic layer 2*b* comprises a second organic matrix material, for example, NET218, E093 or NET382. The first organic layer 2*a* has a layer thickness between 5 nm inclusive and 200 nm inclusive and the second organic layer 2b has a layer thickness between 2 nm inclusive and 20 nm inclusive. A metallic layer 2c is arranged over the entire surface of the second organic layer 2b. The metallic layer 2c consists essentially, for example, of calcium and has a layer thickness of between 1 nm inclusive and 10 nm inclusive. The second organic layer 2b may be doped with the metal of the metallic layer 2c (not shown) at least in partial regions. In this case, the metal of the metal layer 2c can be driven into the second organic layer 2b when the metallic layer 2c is applied. Advantageously, the electron conductivity of the second organic matrix material can thus be increased. It is also possible for the metal (atoms or ions of the metal) to partially migrate into the second organic layer 2b during the operation of the component. Advantageously, the metal of the metal layer cannot penetrate into the first organic layer 2a of the electron injection layer 2, since the first organic matrix material, for example, NET18 or ETM036, forms a barrier for the penetration of the metal. As a result, the migration of the metal atoms or ions into the first organic layer is suppressed or virtually suppressed, and in the vicinity of the active layer and in the active layer (not shown here), in particular the light-emitting layer, there are no or substantially less metal atoms or ions which can lead to an emission extinction. A cathode 1 is arranged above the electron injection layer 2. The cathode 1 may be formed from Al or Ag, for example.

Figure 1C:
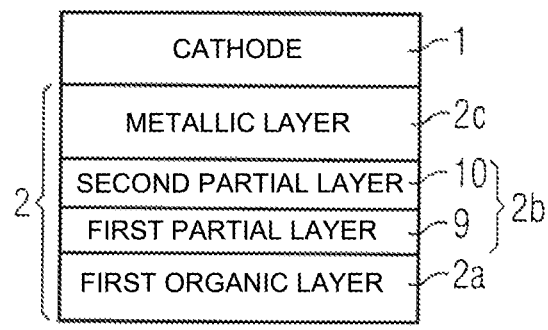
Figure 1B:
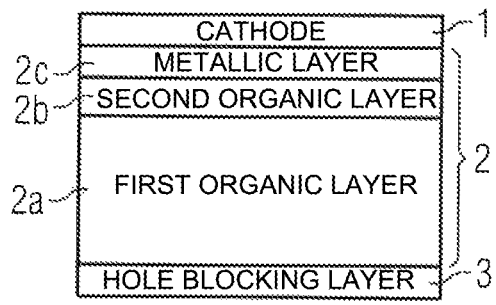

According to FIG. 1B, the section of an organic electronic component, in particular an organic light-emitting diode, in comparison to the section from FIG. 1A, a hole blocking layer 3 is provided, above which the electron injection layer 2 and the cathode 1 are arranged. For example, the hole blocking layer comprises TMM-147, TMM-127, TMM-004, BAlq, BCP, TAZ, PBD, TPBI, Spiro-TAD or consists essentially of one of these materials.

According to FIG. 1C, the second organic layer 2b of the section of an organic electronic component, in particular an organic light-emitting diode, in comparison to the section from FIG. 1A, a first partial layer 9 and a second partial layer 10 are provided. The first partial layer 9 is arranged above the first organic layer 2a and the second partial layer 10 is arranged between the first partial layer 9 and the metallic layer 2c. The second partial layer 10 comprises the second matrix material and is doped with the calcium of the metallic layer 2c. In particular, the second partial layer consists essentially of the second matrix material and the calcium. In this case, a concentration gradient of the doping can be present, wherein in particular the concentration of calcium in the second partial layer 10 increases in the direction from the first organic layer 2a to the metallic layer 2c.

The first partial layer 9 comprises the second organic matrix material and is not doped with the metal of the metallic layer 2c. The first partial layer 9 can also consist essentially of the second organic matrix material.

Figure 1D:
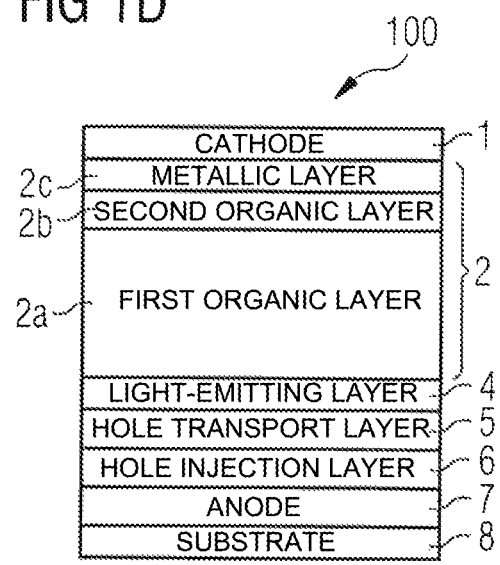
FIG. 1D shows a schematic side view of an organic light-emitting diode.

FIG. 1D shows an exemplary embodiment of an organic electronic component, in particular an organic light-emitting diode. The light-emitting diode comprises a substrate, for example, a glass substrate. An anode is arranged above the substrate. The anode 7 consists essentially of, for example, ITO (indium tin oxide) and is transparent. A hole injection layer 6 is arranged on the anode 7. A hole transport layer 5 is arranged above the hole injection layer 6. A light-emitting layer 4 is arranged above the hole transport layer 5. The hole injection layer 6 may comprise, for example, TPD (N,N'-Bis(3-methylphenyl)-N,N'-bis(phenyl)-benzidine) and the hole transport layer may comprise NPB (N,N'-Bis(naphthalen-1-yl)-N,N'-bis(phenyl)benzidine). The light-emitting layer 4 may comprise, for example, a polyfluorene or an iridium compound. Between the hole transport layer 5 and the light-emitting layer 4 an electron-blocking layer may be arranged, comprising, for example, 2,2'-Bis[N,N-bis(biphenyl-4-yl)amino]9,9-spiro-bifluorene (not shown here). An electron injection layer is arranged over the entire surface of the light-emitting layer, above which in turn a cathode 1, for example, out of Al, is arranged. The electron injection layer is constructed as illustrated in FIG. 1A or 1C. Advantageously, the first organic layer forms a barrier for the metal of the metallic layer. As a result, in the vicinity of the light-emitting layer 4 and in particular in the light-emitting layer 4 there are none or almost no metal atoms or ions which can lead to an emission extinction. In this way, a high light yield and a good luminance stability of the light-emitting diode can advantageously be achieved. A thin-film encapsulation, for example, out of aluminum oxide, may be arranged above the cathode 1 (not shown here). The materials specified for the substrate 8, the anode 7, the hole injection layer 6, the hole transport layer 5, the light-emitting layer 4, the electron-blocking layer and the thin-film encapsulation are not restricted to these materials. Rather, other materials known to the person skilled in the art can also be used for these layers.

Figure 2A:
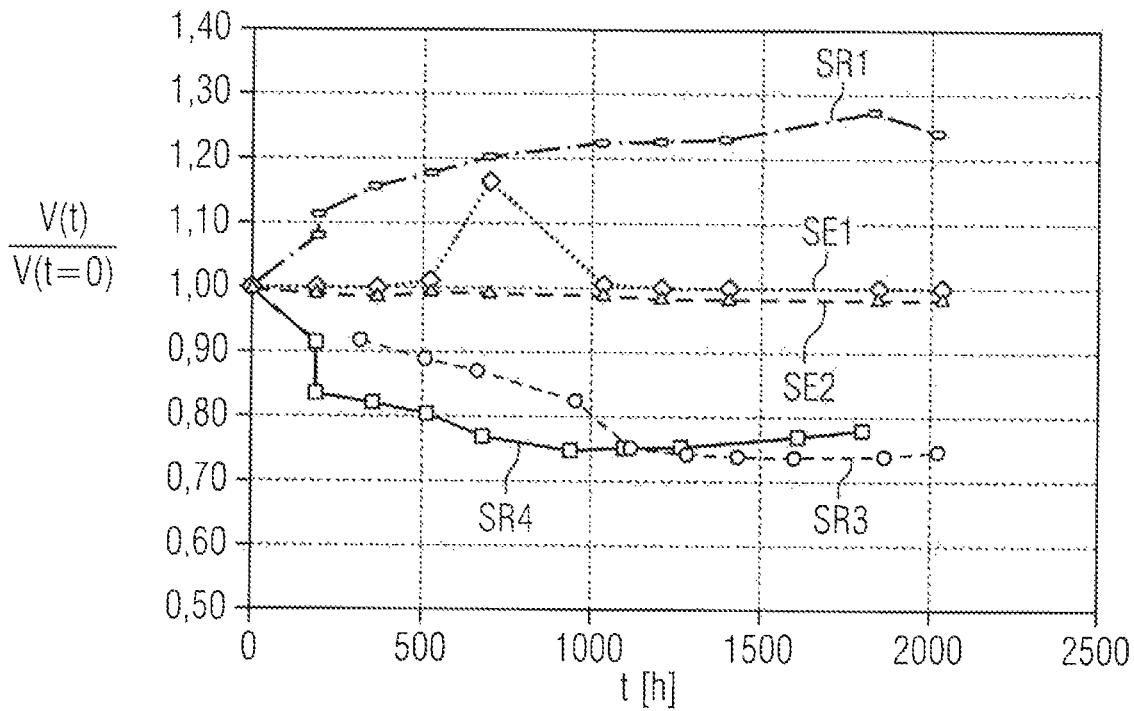
FIG. 2A shows the voltage stability of different organic light-emitting diodes.

In the diagram of FIG. 2A, the normalized voltage V(t)/V(t=0) is plotted against the storage time t in hours h of an organic light-emitting diode at a temperature of 105° c. The curves with the reference symbols SR1, SR3 and SR4 show the voltage stability for comparison examples of organic light-emitting diodes R1, R3 and R4 and the curves with the reference symbols SE1 and SE2 show the voltage stability for inventive organic light-emitting diodes E1 and E2.

The light-emitting diodes R1, R3, R4, E1 and E2 are constructed identically apart from the electron injection layers. The light-emitting diode R1 has a single-layer electron injection layer comprising or essentially consisting of an organic matrix material, doped with an organic dopant, and the light-emitting diodes R3 and R4 each have a single-layer electron injection layer comprising or essentially consisting of an organic matrix material, doped with a metal. The inventive light-emitting diodes SE1 and SE2 each have a three-layer electron injection layer. The three-layer electron injection layer of the light-emitting diodes SE1 and SE2 consists of a first organic layer, a second organic layer and a metallic layer. The first organic matrix material has a higher electron conductivity than the second organic matrix material.

As can be seen, the voltage of the inventive organic light-emitting diodes E1 and E2 is constant or virtually constant, so that the inventive organic light-emitting diodes E1 and E2 have the best voltage stability during storage at a temperature of 105° c.

Figure 2B:
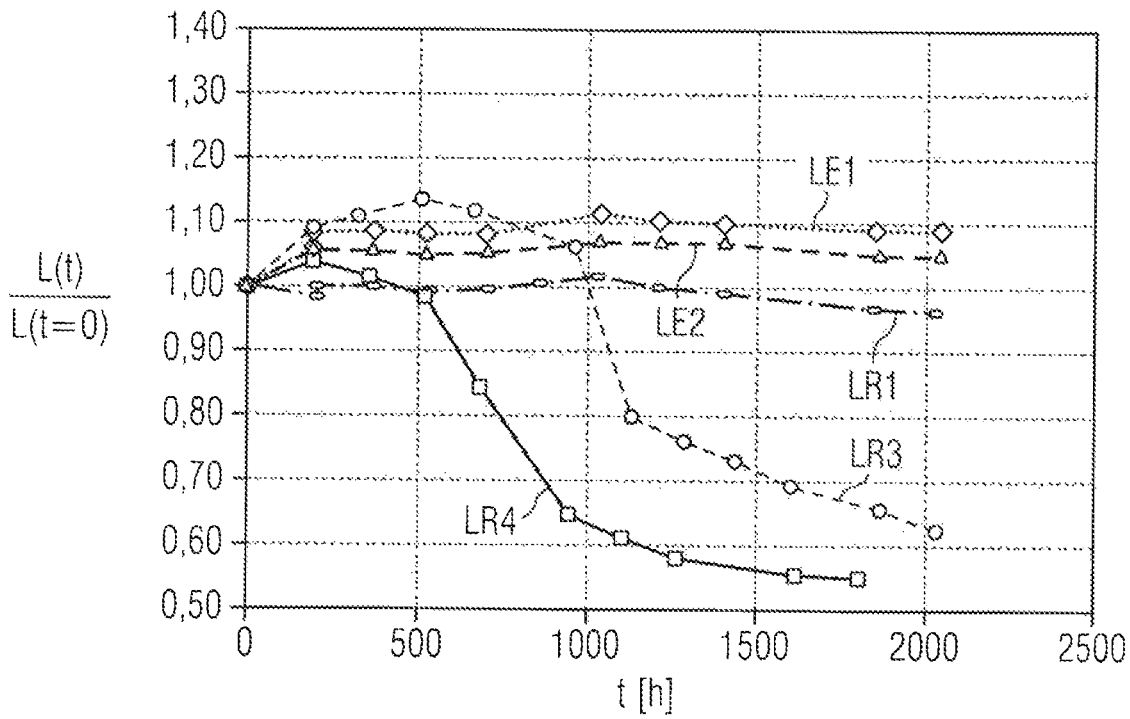
FIG. 2B shows the luminance stability for different organic light-emitting diodes.

In the diagram of FIG. 2B, the normalized luminance 1(t)/1(t=0) is plotted against the storage time t in hours h of an organic light-emitting diode at 105° C. The curve with the reference symbols LR1, LR3 and LR4 show the luminance stability for comparison examples of organic light-emitting diodes R1, R3 and R4, and the curves with the reference symbols LE1 and LE2 show the luminance stability for inventive organic light-emitting diodes E1 and E2.

The light-emitting diodes are constructed as described in FIG. 2A.

As can be seen, the luminance of the inventive organic light-emitting diodes E1 and E2 is constant or virtually constant, so that the inventive organic light-emitting diodes E1 and E2 have the best luminance stability.

The invention is not restricted to the exemplary embodiments by the description on the basis of the exemplary embodiments. Rather, the invention comprises any new feature and also any combination of features, which includes in particular any combination of features in the patent claims, even if this feature or this combination itself is not explicitly specified in the patent claims or exemplary embodiments.

The invention claimed is:

1. An organic electronic component comprising
an anode;
an active layer arranged above the anode;
an electron injection layer arranged above the active layer, the electron injection layer comprising:
a first organic layer comprising a first organic matrix material;
a second organic layer comprising a second organic matrix material; and
a metallic layer comprising a metal,
wherein the second organic layer is doped with the metal and comprises a concentration gradient of the doping of the metal; and
a cathode arranged above the electron injection layer, wherein the cathode is arranged directly above the metallic layer.

2. The organic electronic component according to claim 1, wherein the metal of the metallic layer is selected from the group consisting of Li, Na, Ca, Mg, Yb, Cs, Sr, Rb, K, and combinations thereof.

3. The organic electronic component according to claim 1, wherein the metallic layer has a layer thickness of between and inclusive 1 nm and 10 nm.

4. The organic electronic component according to claim 1, wherein the cathode comprises a material selected from the group consisting of Ag, Pt, Au, Mg, Al, Ba, In, Ca, Sm, or Li, and compounds, combinations or alloys thereof.

5. The organic electronic component according to claim 1, wherein the second organic layer comprises a first partial layer and a second partial layer.

6. The organic electronic component according to claim 5, wherein the first partial layer is not doped with the metal of the metallic layer.

7. The organic electronic component according to claim 1, wherein the first organic matrix material has a higher electron conductivity than the second organic matrix material.

8. The organic electronic component according to claim 1, further comprising an encapsulation above the cathode.

9. An organic electronic component comprising
an anode;
an active layer arranged above the anode;
an electron injection layer arranged above the active layer, the electron injection layer comprising:
a first organic layer comprising a first organic matrix material;
a second organic layer comprising a second organic matrix material; and
a metallic layer comprising a metal,
wherein the second organic layer is doped with the metal of the metallic layer at least in partial regions; and
a cathode arranged above the electron injection layer, wherein the cathode is arranged directly above the metallic layer.

10. The organic electronic according to claim 9, wherein the second organic layer comprises a first partial layer and a second partial layer.

11. The organic electronic component according to claim 9, further comprising a substrate comprising a material selected from the group consisting of glass, quartz, and plastic.

12. The organic electronic component according to claim 9, wherein a hole blocking layer arranged between the active layer and the electron injection layer, wherein the hole blocking layer includes an organic material, the organic material having a lower-lying HOMO than the first organic matrix material and/or the second organic matrix material.

13. The organic electronic component according to claim 12, wherein the hole blocking layer comprises TMM-147, TMM-127, TMM-0044, BAlq, BCP, TAZ, PBD, TPBI, Spiro-TAD or consist essentially of one of these materials.

14. The organic electronic component according to claim 9, wherein the first organic layer has a thickness between 5 nm inclusive and 60 nm inclusive.

15. The organic electronic component according to claim 9, wherein the second organic layer has a thickness between 2 nm inclusive and 20 nm inclusive.

16. The organic electronic component according to claim 9, wherein an electron injection into the active layer is almost constant at temperatures up to 150° C.

17. Method for operating an organic electronic component,
wherein the organic electronic component comprises
an anode;
an active layer arranged above the anode;
an electron injection layer arranged above the active layer, the electron injection layer comprising:
a first organic layer comprising a first organic matrix material;
a second organic layer comprising a second organic matrix material; and
a metallic layer comprising a metal;
a cathode arranged above the electron injection layer;
wherein the metal penetrates partially into the second organic layer, wherein the cathode is arranged directly above the metallic layer.

18. The method according to claim 17, wherein the metal of the metallic layer cannot expand into the first organic layer.

* * * * *